(12) United States Patent
Kuehn

(10) Patent No.: US 8,931,307 B2
(45) Date of Patent: Jan. 13, 2015

(54) BLANK OF TITANIUM-DOPED GLASS WITH A HIGH SILICA CONTENT FOR A MIRROR SUBSTRATE FOR USE IN EUV LITHOGRAPHY AND METHOD FOR THE PRODUCTION THEREOF

(75) Inventor: Bodo Kuehn, Gelnhausen (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 311 days.

(21) Appl. No.: 13/499,352

(22) PCT Filed: Sep. 28, 2010

(86) PCT No.: PCT/EP2010/064317
§ 371 (c)(1),
(2), (4) Date: Mar. 30, 2012

(87) PCT Pub. No.: WO2011/039159
PCT Pub. Date: Apr. 7, 2011

(65) Prior Publication Data
US 2012/0183719 A1 Jul. 19, 2012

(30) Foreign Application Priority Data

Sep. 30, 2009 (DE) .................. 10 2009 043 680

(51) Int. Cl.
*B32B 17/00* (2006.01)
*C03B 23/13* (2006.01)
*C03B 23/20* (2006.01)
*C03B 19/14* (2006.01)
*C03B 32/00* (2006.01)
*C03C 3/06* (2006.01)

(52) U.S. Cl.
CPC .............. *C03B 23/20* (2013.01); *C03B 19/1453* (2013.01); *C03B 32/00* (2013.01); *C03C 3/06* (2013.01); *C03B 2201/42* (2013.01); *C03C 2201/42* (2013.01)
USPC ............................................. 65/33.5; 65/55

(58) Field of Classification Search
USPC ...................................................... 65/33.5, 55
See application file for complete search history.

(56) References Cited

U.S. PATENT DOCUMENTS

| | | | |
|---|---|---|---|
| 5,270,080 A * | 12/1993 | Mino et al. ................. | 427/430.1 |
| 2002/0043081 A1 | 4/2002 | Bowden | |
| 2007/0137252 A1 | 6/2007 | Maxon et al. | |
| 2007/0246156 A1 | 10/2007 | Kohlmann et al. | |
| 2008/0019652 A1 * | 1/2008 | Steenblik et al. ............. | 385/131 |
| 2008/0274869 A1 | 11/2008 | Englisch | |

FOREIGN PATENT DOCUMENTS

DE    10 2004 024808 A1    12/2005

* cited by examiner

*Primary Examiner* — Brent O'Hern
(74) *Attorney, Agent, or Firm* — Tiajoloff and Kelly LLP

(57) ABSTRACT

On the basis of a known method for producing a blank of titanium-doped glass with a high silica content (glass) for a mirror substrate for use in EUV lithography which has a surface region that has an outer contour, is intended to be provided with a reflective coating and is specified as a highly loaded zone when the mirror substrate is used as intended, in order to provide a blank which can be produced at low cost and nevertheless meets high requirements with respect to homogeneity and freedom from blisters and striae, a procedure which comprises the following method steps is proposed: (a) producing a front body of titanium-doped high-quality glass with dimensions more than large enough to enclose the outer contour, (b) producing a cylindrical supporting body from titanium-doped glass, (c) bonding the front body and the supporting body to form a composite body, and (d) working the composite body to form the mirror substrate blank, wherein the step of producing the front body comprises a homogenizing process involving twisting a starting body obtained in the form of a strand by flame hydrolysis of a silicon-containing compound to form a front body blank, and the supporting body is formed as a monolithic glass block with less homogeneity than the front body.

13 Claims, 2 Drawing Sheets

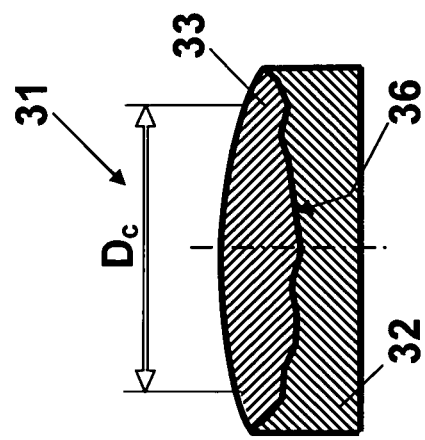
Fig. 9
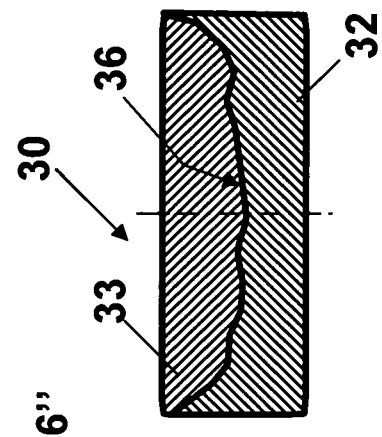
Fig. 8
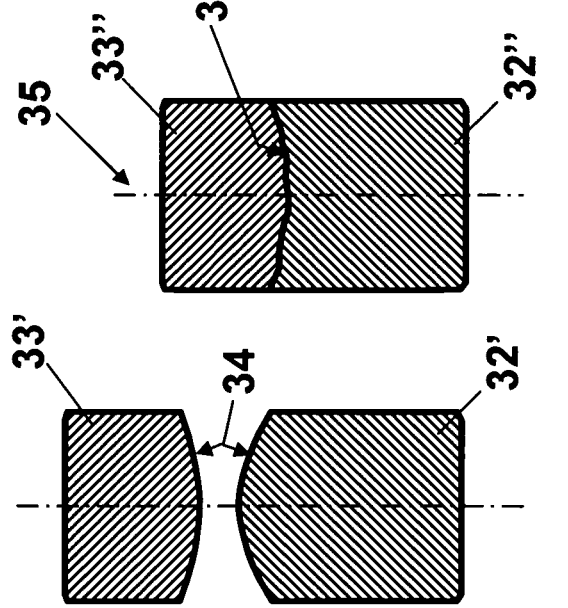
Fig. 7
Fig. 6

BLANK OF TITANIUM-DOPED GLASS WITH A HIGH SILICA CONTENT FOR A MIRROR SUBSTRATE FOR USE IN EUV LITHOGRAPHY AND METHOD FOR THE PRODUCTION THEREOF

The present invention refers to a blank of titanium-doped, highly siliceous glass for a mirror substrate for use in EUV lithography, comprising a surface area ($D_c$) which has an outer contour and which is designated to be metalized and which is specified as a highly stressed zone during the intended use of the mirror substrate.

Furthermore, the present invention refers to a method for producing such a blank of titanium-doped, highly siliceous glass for a mirror substrate for use in EUV lithography.

PRIOR ART

In EUV lithography, highly integrated structures with a line width of less than 50 nm are produced by means of microlithographic projectors. Extreme ultraviolet (EUV) light, also called soft X-ray radiation is here used at wavelengths of less than 15 nm. The projectors are equipped with mirror elements that consist either of highly siliceous and titanium-dioxide doped glass (hereinafter also called "titanium-doped glass" or just "glass") or of an aluminum silicate glass ceramic and that are provided with a reflective coating. These materials are distinguished by an extremely low thermal expansion coefficient, so that they do not deform due to heating during the exposure process, which would deteriorate the imaging quality.

The thermal expansion of the mirror element is mainly determined in the case of titanium-doped glass by the concentration and local distribution of the dopant in the mirror element and by the thermal history of the mirror element blank.

A glass blank for a mirror substrate of the aforementioned type and a method for its manufacture are known from DE 10 2004 024 808 A. Described is a circular cylindrical mirror substrate plate having a diameter of 300 mm and a thickness of 40 mm. The mirror substrate plate consists of titanium-doped synthetic quartz glass of a very high homogeneity. One of the plane surfaces of the mirror substrate plate is metalized either entirely or in part and is positioned during the intended use of the mirror substrate in a direction perpendicular to the main propagation direction of the soft X-ray radiation.

The surface area around the impingement area of the X-ray radiation is highly stressed during the intended use and is particularly highly specified in terms of its suitability and properties. This mainly regards the surface quality, the homogeneity of the dopant distribution in the highly stressed area, the spatial distribution of the thermal expansion coefficient, and the temperature dependence thereof, as well as the so-called 'zero crossing temperature', which designates the temperature at which the thermal expansion coefficient is just zero.

A high (micro-) homogeneity of the titanium distribution (i.e. the absence of layers) makes it possible to implement a particularly high surface quality by means of a more exact polishability, e.g. by chemical mechanical polishing (CMP). By comparison, the medium-wave and long-wave homogeneity of the titanium distribution is rather suited for a low-deformation application of the mirror element during use in that length variations caused by temperature gradients are avoided as much a possible in the highly stressed areas. It should here be noted that the maximum (theoretical) reflectivity of an EUV mirror element is about 70%, so that at least 30% of the radiation energy are converted into heat. For reasons of a more exact polishability and uniform expansion, attention must here also be paid that there are no or hardly any bubbles.

A projection device contains a multitude of such mirror substrates that contain not only planar, but also convexly or concavely curved, metalized surfaces with an outer contour adapted to the specific use. This outer contour is produced by mechanical treatment of a mirror substrate blank that typically comprises cutting, grinding and polishing steps. In this mechanical treatment, surface areas are exposed from the volume of the mirror substrate blank, and these will subsequently form the surface to be metalized and particularly also the surface area of the highly stressed zone. Inhomogeneities previously entrapped in the volume, e.g. layers and bubbles, can here pass to the surface and impair the surface quality.

To ensure high homogeneity as well as the absence of bubbles in the glass, DE 10 2004 024 808 A therefore suggests that a glass blank containing layers or striations should be homogenized with the help of a multi-step forming method. With this homogenizing method it is possible to produce a mirror substrate blank of titanium-doped glass that is free of striations and striae in three directions and exhibits a homogeneous dopant distribution. The method is however complicated and considerably increases the manufacturing costs for mirror substrates of such types.

US 2002/0043081 A1 describes a preform of titanium-doped, highly siliceous glass for producing a plurality of aspherical mirror substrate blanks for use in EUV lithography. The preform is configured as a composite body, the area to be metalized being entirely formed from a front plate that is fused with a support body in the form of a honeycomb. Front body and support body consist preferably of titanium-doped glass with similar or identical thermal expansion coefficients at both sides. The two bodies are joined by fusion, welding using a frit or adhesive bonding, and the top side of the front body is subsequently polished for accommodating the mirror layers.

The individual aspherical mirror substrate blanks are produced by cutting out sections from the composite body. Stress relaxation may cause deformations of the sections that have a detrimental effect on the surface quality. This deformation effect is reduced by the honeycomb form of the support body.

The production of the honeycombed support body of titanium-doped glass is however very complicated and as such not adequate for preventing the said deformation effect caused by stress relaxation. A post-polishing of the cut-out sections is very difficult because of their aspherical shape since the edges are thereby easily subjected to circular grinding.

TECHNICAL OBJECTIVE

It is therefore the object of the present invention to provide a mirror substrate blank of synthetic, highly siliceous glass for use in EUV lithography that can be produced at low costs and nevertheless satisfies the high demands made on homogeneity as well as absence of bubbles and striae.

Moreover, it is the object of the present invention to provide a method for producing such a mirror substrate blank from titanium-doped synthetic glass.

As for the method, this object, starting from a method of the aforementioned type, is achieved by the following method steps:
(a) producing a front body of titanium-doped glass of high homogeneity with a volume "V1" and with dimensions enclosing the outer contour with an oversize;

(b) producing a support body of titanium-doped glass with a volume "V2", the support body being configured as a monolithic glass block of lower homogeneity than the front body;

(c) joining front body and support body so as to form a composite body; and (d) treating the composite body to obtain the mirror substrate blank, wherein the production of the front body includes a homogenizing process which comprises the twisting of a rod-shaped start body obtained by flame hydrolysis of a silicon-containing compound to form a front body blank, wherein the start body is held during the shaping process between two holders, is zonewise heated to melting temperature and the heated zone is thereby worked by relative movement of the two holders to each other so as to form a substantially cylindrical twist body.

The invention is based on the finding that in contrast to microlithography in the ultraviolet wavelength range in which projection systems are used with optical components for transmission operation, the mirror elements used in EUV lithography do not require complete homogeneity over the whole thickness of the mirror element, but only over a partial thickness. This partial thickness depends on the outer contour of the finished mirror element in its highly stressed zone. The reason is that during the mechanical treatment of the mirror substrate blank for producing the outer contour, new surface is only exposed in a volume portion that is predetermined by the dimensions of the outer contour to be produced. It is important that the glass in said volume portion exhibits high homogeneity and absence of bubbles, whereas these demands are not so strict for the remaining volume portions of the mirror substrate. The volume proportion of synthetic glass that has to satisfy particularly high demands on homogeneity is hereinafter also called "highly specified volume proportion".

According to the invention a mirror substrate blank is produced that is present in the form of a composite consisting of several components, including a support body and a front body. The production of the composite body, however, does not serve to improve a product, as in the above-explained prior art, but serves to reduce the costs at the same performance or even at a slightly lower performance than in a monolithic mirror substrate.

The front body provides at least the glass for the "highly specified" volume proportion" and a certain oversize. The glass of the front body satisfies the high demands made on the homogeneity of the dopant distribution and the absence of bubbles so as to ensure a more exact polishability of the surface to be metalized, as well as a uniformly low expansion in the highly stressed volume portion of the mirror element. These quality requirements that are made on the glass of the front body are satisfied by a homogenizing process that comprises a twisting of a rod-shaped start body obtained by flame hydrolysis of a silicon-containing compound into a front body blank, wherein the start body is held during the shaping process between two holders, is zonewise heated to melting temperature and the heated zone is thereby worked by relative movement of the two holders to each other so as to form a substantially cylindrical twist body.

The working (twisting) of the rod-shaped start body primarily serves the elimination of striae and layers in the glass that are also due to an inhomogeneous mass and dopant distribution. The result of this homogenizing process is a blank consisting of homogeneous high-quality glass, from which at least one front body, but preferably a plurality of front bodies can be produced.

The support body is present as a simple monolithic glass block which consists of a glass of lower quality that satisfies especially smaller demands on the homogeneity of the dopant distribution and the absence of bubbles than in the case of the front body glass of higher quality. Likewise, the demands made on other parameters that are of relevance to the use as an EUV mirror substrate, namely the spatial distribution of the thermal expansion coefficient and the temperature dependence thereof, as well as the 'zero crossing temperature' can be lessened in the support body for the reason that the thermal load is here smaller than in the front body due to the absorption of radiation.

This results in lower manufacturing costs for the glass of the support body and thus the saving of costs in comparison with a mirror substrate blank which fully consists of high-quality glass or a composite body of a high-quality front body and a support body in honeycomb structure.

The difference in the homogeneity between front body and support body manifests itself in the spatial dopant distribution that is particularly expressed in the form of layers and striae and leads to refractive index inhomogeneities and to a spatially inhomogeneous distribution of the thermal expansion coefficient. The characterization of the homogeneity of the glasses is carried out on the basis of the number of striae per volume unit. Striae are generated by local variations in the composition. They can be sensed quantitatively by means of a microprobe that measures differences in the composition that in turn correlate with differences in the thermal expansion coefficient up and into the range of a few ppb/° C. The information is given as a root-mean-square (rms) value in the unit MPa. The method is e.g. described in EP 2 211 232 A1. In this sense the glass of the front body shows a higher homogeneity and thus a smaller rms value than the glass of the support body. As a rule, highly siliceous titanium-doped glass that is not homogenized or only homogenized in one direction shows a lower degree of homogenization than highly siliceous titanium-doped glass that is homogenized in all spatial directions.

Support body and front body consist of glass that is doped with titanium dioxide. In addition, other dopants may be contained, such as fluorine. Ideally, the glass of the support body has the nominally identical composition as the glass of the front body.

Front body and support body can be joined without any significant deformation of said parts (e.g. by welding or joining using a similar joining mass of titanium-doped glass), or the process is accompanied by a deformation of the parts. Even a composite of front body and support body that has already been produced can still be subjected to a deformation process.

The treatment of the composite body to obtain the mirror substrate body may e.g. comprise a mechanical treatment. a hot forming process and/or a thermal treatment of the composite body. As a rule, it does not yet have the outer contour of the surface to be metalized. To produce said contour, the mirror substrate blank is mechanically worked to obtain the mirror substrate. As a rule, concavely or convexly curved surface areas are here produced. The quality of the treated volume of the mirror substrate blank is here decisive for the quality of the exposed surface. For instance, the treated volume must not contain bubbles or layers because these will appear on the surface due to removal during mechanical treatment and may impair the surface quality. The front body is dimensioned such that the removal depth during mechanical treatment for producing the outer contour is smaller at any place than the dimension of the front body as found there. Hence, the surface in the highly stressed zone after completion of the mechanical treatment is exclusively formed from glass of the homogeneous front body. This also guarantees a high surface quality in the highly stressed zone.

It is true that the use of the monolithic support body to be produced without any great efforts lowers the manufacturing costs for the mirror substrate blank, but one has to put up with drawbacks in terms of performance.

Preferably, the cylindrical twist body is subjected to a further homogenizing process by twisting and is shaped into a twist body homogenized in three directions.

It has turned out to be useful when the production of the front body additionally comprises a shaping of a cylindrical start body by way of softening and outflowing into a heated mold into which the glass flows out under the action of a force in the transverse direction relative to the longitudinal axis of the cylinder so as to form a homogenized start body. A front body, preferably a plurality of front bodies, is cut out from the glass homogenized in this way.

DE 42 04 406 A1 describes how a cylindrical start body of glass is allowed to flow out into a heated mold. This shaping process also leads to a homogenization of the glass until absence of striae and layers in three directions. Possibly remaining bubbles are also reduced in size. The force acting on the start body is e.g. the gravitational force due to the start body's own weight, optionally supplemented by additional weight acting on the start body and/or by pressure exerted on the start body. The start body is e.g. a twist body that has not been fully homogenized yet.

Preferably, at least one front body, preferably a plurality of front bodies, are obtained by cutting from the twist body or from the homogenized twist body, respectively, or from the homogenized start body, respectively.

In addition, the production of the front body comprises the manufacture of a preform of synthetic glass and a selecting method step in which a section of high quality with respect to absence of bubbles and homogeneity of the dopant distribution is selected from the preform, and the front body is cut out therefrom.

The front body is here produced by selecting suitable volume portions of a large-volume, normally cylindrical, glass preform and by cutting out said volume portions. The volume portions of the large-volume preform which are not suited for the production of the front body can be used for producing the support body.

The glass for the support body is produced either in another process in which the homogenizing efforts are smaller than in the case of glass for the front body, or the glass of the support body is produced with the help of the same process as the glass of the front body. In the last-mentioned case, one normally obtains a large-volume preform of glass from which volume portions of minor quality and homogeneity can be identified and sorted out as glass for the support body.

In particular, the production of the support body preferably comprises homogenizing a rod-shaped support body/start body obtained by flame hydrolysis of a silicon-containing compound into a twist body, wherein the support body/start body is held between two holders during shaping, is zonewise heated to melting temperature and the heated zone is thereby worked by relative movement of the two holders relative to each other so as to form a substantially cylindrical twist body, with the support body being obtained from the glass of the twist body.

It has turned out to be useful when the joining process according to method step (c) comprises a joining step in which a plane contact surface of the front body and a plane contact surface of the support body are joined by optical contacting and are welded to each other.

The optical joining process permits a bubble-free joining of support body and front body. These abut on each other with plane-polished contact surfaces; this facilitates a bubble-free welding of front body and support body without any significant deformation. Welding is e.g. carried out by local heating and softening in the area of the contact surfaces by means of laser, plasma flame or fuel gas flame, Preferably, however, the contact surfaces are softened in a furnace. The assembly of support body and front body is here fully introduced into a furnace and heated. This facilitates the reproducible production of a defect-free bond.

As an alternative, a procedure for producing the bond between support body and front body according to method step (c) has also turned out to be suited, comprising a joining step in which the front body positioned on the support body is softened in a furnace and deformed together with said support body and immerses at least in part into the support body in said process.

In this procedure the generation of a melt composite between support body and front body is accompanied by a plastic deformation of the bodies abutting on each other so as to obtain the composite body. The glass of the underlying support body, which is homogenized simultaneously for the first time or in addition, is here mainly subjected to deformation. The deformation is preferably carried out by softening and permitting outflow into a heated mold as has already been explained in more detail above for the homogenization of a start body of glass.

The heated mold predetermines the lateral dimensions of the composite body resulting after the deformation. The front body immerses here in part into the softened glass of the support body. The mass distribution of the front body fused to the support body, which mass distribution is obtained thereafter, can be detected by way of tests and determined by simulation.

This procedure of "letting the front body immerse" into a soft support body mass offers the advantage that final position and final geometry of the front body can be predetermined relatively accurately. One obtains an intimate and low-bubble contact area and at the same time one needs less feedstock mass for the front body than in joining methods exhibiting great changes in form that normally require more front body mass than would in fact arithmetically be needed. In the finished composite body the original front body forms a front body area that is embedded at least in part in a support body area, i.e., it is laterally fixed. This yields a fixed composite in the case of which the risk of delamination is diminished even in the case of mechanical treatment.

In a further, equally qualified procedure for producing the composite between front body and support body according to method step (c), a joining step is provided in which a contact surface of the front body and a contact surface of the support body are softened and pressed against each other, with at least one of the contact surfaces having an outwardly curved surface.

In this instance, front body and support body, preferably in block or rod form, are pressed together with their respective faces and are simultaneously softened, so that the contact surfaces are fused together at the same time. The fusion is e.g. carried out on a lathe-like apparatus by means of which the front body and the support body are rotatable about a joint rotation axis and are axially displaceable in the direction of the rotation axis. To avoid the inclusion of bubbles, at least one of the contact surfaces, preferably both contact surfaces, comprises an outwardly curved surface, so that upon contact one obtains a substantially point-like (and not a large-area) contact surface that upon continued compression propagates radially to the outside. In the simplest case, the curved contact areas are made acute or conical. The melt composite body produced thereby can subsequently be subjected to a hot forming process for further homogenization, whereby the final geometry of the composite body is obtained.

It has also turned out to be useful when the composite body is annealed.

The temperature treatment serves to reduce possible stresses that may have been produced during the manufacture of the joint of support body and front body. Such stresses may lead to a deformation of the blank in a subsequent material removal, and they may also have an adverse effect on the polish. The question whether annealing is really needed depends on the temperature control during the joining operation according to method step (c) and particularly during cooling of the composite produced. The annealing treatment optionally comprises one or several hot-processing steps. The formation of the fusion bond according to method step (c) and the annealing treatment are carried out in one operation or in separate operations.

The saving of manufacturing costs is the more efficient, the smaller the volume proportion of the front body in the mirror substrate blank is, Therefore, the volume "V1" of the front body has preferably to be kept as small as possible and only as large as is needed so that a complete modeling of the outer contour in the highly stressed portion of the mirror substrate is permitted. For reasons of safety the front body, however, has a certain oversize extending beyond the minimum size.

Advantageously, the volume "V2" is at least twice as large, particularly preferably at least three times as large, as "V1".

As for the blank consisting of titanium-doped glass for a mirror substrate for use in EUV lithography, the aforementioned object starting from a blank of the aforementioned type is achieved in that the blank is present as a melt composite body that encloses a front body portion of titanium-doped glass of high homogeneity with a volume "V1" and with dimensions enclosing the outer contour with an oversize, and a support body portion of titanium-doped glass with a volume "V2" in the case of which the support body portion is configured as a monolithic glass block of lower homogeneity than the front body portion.

The invention is based on the finding that, in contrast to microlithography in the ultraviolet wavelength range where projection systems are used with optical components for the transmission operation, the mirror elements used in EUV lithography do not require complete homogeneity over the whole thickness of the mirror element, but only over a partial thickness thereof. This partial thickness depends on the outer contour of the finished mirror element in its highly stressed zone. The reason is that during the mechanical treatment of the mirror substrate blank for producing the outer contour, new surface is only exposed in a volume portion predetermined by the dimensions of the outer contour to be produced. It is important that the glass in this volume portion exhibits high homogeneity and absence of bubbles, whereas these demands are less strict in the remaining volume portions of the mirror substrate. The volume portion of synthetic glass that has to satisfy particularly high demands on homogeneity shall also be called "highly specified volume proportion" in the following.

According to the invention the mirror substrate blank is present in the form of a composite consisting of several components that form a support body area and a front body area. The front body area provides at least the glass for the "highly specified volume proportion" and a certain oversize. The glass of the front body meets the high demands made on the homogeneity of the dopant distribution and on the absence of bubbles so as to guarantee a more exact polishability of the surface to be metalized and a uniform small expansion in the highly stressed volume portion of the mirror element.

The support body portion is present as a simple monolithic glass block, consisting of inferior glass, with lower demands being made on the homogeneity of the dopant distribution and the absence of bubbles as compared with the superior glass of the front body portion. This results in lower manufacturing costs for the glass of the support body portion and thus the saving of costs in comparison with a mirror substrate blank which fully consists of high-quality glass or a composite body of a high-quality front body and a support body in a honeycomb structure. The glass of the support body portion can also differ from the glass of the front body in properties other than the homogeneity.

When the mirror substrate blank is mechanically treated for forming the outer contour of the mirror to be metalized, concavely or convexly curved surface areas are normally produced. The quality of the thereby treated volume of the mirror substrate blank is of relevance to the quality of the exposed surface. To be more specific, the treated volume should not contain any bubbles, as these will appear on the surface due to removal in the mechanical treatment and they may impair the surface quality. The front body portion is therefore dimensioned such that the removal depth in the case of the mechanical modeling of the outer contour is smaller at any place than the dimension of the front body portion as found there. Hence, the surface in the highly stressed zone after completion of the mechanical treatment is exclusively formed from glass of the homogeneous front body. This also ensures a high surface quality in the highly stressed zone.

Support body area and front body area consist of glass doped with titanium dioxide. In addition other dopants may be contained, such as fluorine.

The blank according to the invention is preferably produced on the basis of the above-discussed method in that a front body and a support body are interconnected.

It has turned out to be useful when the front body portion consists of a glass that is free of striae in three directions.

Such a glass is distinguished by a particularly high homogeneity of the dopant distribution and by the substantial absence of bubbles. The volume proportion V1 of this glass quality, which has been homogenized under great efforts, in the composite body according to the invention is as small as possible. A suitable homogenizing method for the complete removal of striae and layers, and thus for the production of a glass that is free of striae in three directions, is described in EP 673 8888 A1.

By contrast, the support body portion consists preferably of a glass which is only free of striae in one direction.

Such a glass is less expensive than a glass that is free of striae in three directions because its homogenization requires fewer efforts.

To meet the high demands made on the quality of the glass in the highly stressed zone, while keeping the material costs for the mirror substrate blank as small as possible, the front body portion consists preferably of glass that in conformity with DIN 58927 2/70 meets the demands of Bubble Class 2 or better, whereas the support body portion consists of glass that in conformity with DIN 58927 2/70 meets the demands of Bubble Class 2 or worse.

The demands made on the quality of the support body portion glass as regards the absence of bubbles are lower than those made on the glass of the front body portion. Preferably, the glass of the support body portion just meets the demands of Bubble Classes 3 to 5 or even worse.

To meet the high quality demands for the glass in the highly stressed zone while keeping the material costs for the mirror substrate blank as small as possible, it has also turned out to be useful when the front body portion consists of glass that shows a distribution of the titanium concentration at which the maximum deviation from the mean value is less than 1%, and when the support body portion consists of glass that shows a distribution of the titanium concentration at which the maximum deviation from the mean value is less than 5%.

The demands made on the quality of the support body portion glass as regards the homogeneity of the dopant distribution are less than those made on the glass of the front body portion. At the usual dopant concentration ($=TiO_2$) of about 7 wt. 5, the glass of the support body portion meets the demands if the maximum deviation from this mean value is less than 0.35 wt. %.

As for a stable bond and small deformation during the intended use of the mirror substrate, front body portion and support body portion ideally consist of glass with nominally identical composition.

As for a boundary surface that is as defect-free as possible, it has turned out to be useful when front body portion and support body portion abut on each other in a flat contact surface and are fused to each other.

Front body portion and support body portion may here have similar or identical lateral dimensions, so that the front body portion fully covers a side (top side) of the support body portion. This embodiment of the blank is particularly suited for applications of the mirror substrate with a large numerical aperture in the case of which the highly stressed zone has to extend over a comparatively large surface area.

In an alternative and equally preferred embodiment of the blank according to the invention, the front body area is partly embedded in the support body portion.

The front body portion is here in contact with the support body mass not only with its bottom side facing the support body portion, but also with at least a part of its lateral boundary areas. The lateral dimensions of the front body portion are here smaller than those of the support body portion, whereby more material costs are saved in a corresponding manner. This embodiment of the blank is particularly suited for applications of the mirror substrate with a small numerical aperture in the case of which the highly stressed zone extends only over a relatively small surface area. Moreover, due to the embedment, one obtains a fixed composite with lateral fixation of the front body portion in the support body portion where the risk of delamination is also reduced in the case of impact stress, e.g. during mechanical treatment.

The saving of manufacturing costs is the more efficient the smaller the volume proportion of the front body portion in the mirror substrate blank is. The volume "V1" of the front body portion is therefore preferably as small as possible and only as large as needed to permit a complete modeling of the outer contour in the highly stressed portion of the mirror substrate. For safety considerations the front body portion, however, has a certain oversize in comparison with the minimum dimension. Advantageously, the volume "V2" is at least twice as large, particularly preferably at least three times as large as "V1".

Embodiment

The invention will now be explained in more detail with reference to an embodiment and a drawing. In a schematic illustration,

BRIEF DESCRIPTION OF THE SEVERAL VIEWS OF THE DRAWINGS(S)

FIG. 6 shows a first method step for producing a mirror substrate blank by joining rod-shaped support body and front body;

FIG. 7 shows a composite body after joining;

FIG. 8 shows a mirror substrate blank obtained by shaping the composite body according to FIG. 7; and FIG. 9 shows a mirror substrate produced from the mirror substrate blank according to FIG. 9 by mechanical treatment, in a side view in section.

Figure 1:
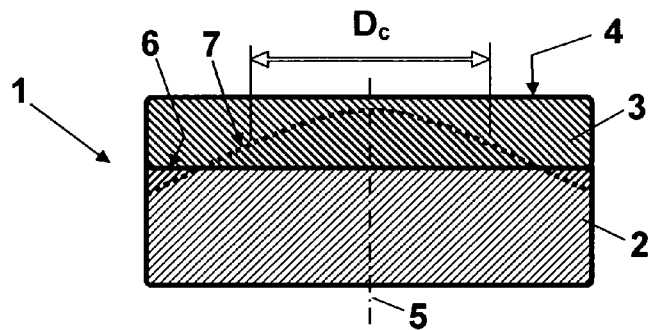
FIG. 1 shows a mirror substrate blank according to the invention, consisting of a weld composite or assembly made up of support body and front body, with outlined outer contour of the mirror substrate to be made therefrom, in a side view in section.

Commercial synthetic glass which is doped with about 7 wt. % $TiO_2$ is used as the start material for the mirror substrate blank 1 schematically shown in FIG. 1.

A first block-shaped selection piece of this start material with the dimensions 150 mm×150 mm×40 mm serves as the support body 2. The glass of the support body 2 shows a clearly visible layered arrangement in two viewing directions whereas the third direction in parallel with the symmetry axis 5 is substantially without any layer structures. The layered arrangement is due to the layerwise build-up process during production of the glass.

The glass contains bubbles having a size of not more than 1.3 mm, the sum of the bubble cross-sections being less than 2 $mm^2$ (based on a volume of 100 $cm^3$). The glass satisfies the demands of Bubble Class 5 according to DIN 58927 2/70. The distribution of the titanium concentration, measured on the basis of the thermal expansion as known from DE 10 2004 024 808, is characterized by a maximum deviation of less than 5% from the nominal mean value of the dopant concentration (7 wt. %).

One of the front sides (top side) of the support body 2 is polished to obtain a plane surface.

The production of a front body 3 by additionally homogenizing another selected sample piece of the same start material with a low bubble content is described hereinafter. This piece is present as a rod-shaped start body with the dimensions 90 mm×90 mm×500 mm. The end portions of the start body at the front side are cylindrically ground, and each end has welded thereto a glass holder, each consisting of titanium-doped glass, so that the expansion characteristics of the holders and start bodies are similar. The start body extended in this way is clamped into a lathe equipped with a heating burner and is homogenized in a shaping process, as is described in EP 673 888 A for the complete removal of layers. The start body is here locally heated by means of the heating burner to more than 2000° C. and softened in this process. The start body is twisted by relative movement of the two holders to each other about its longitudinal axis, the softened glass mass being intensively blended so as to form a twist body in radial direction. The twist body has a diameter of about 90 mm and a length of about 635 mm.

Inhomogeneities or layers of the start body are thereby removed in radial direction, whereas inhomogeneities extending in the longitudinal direction of the start body are maintained as striae or layers. To eliminate these as well, a further shaping process is carried out. In this process the start body is placed in a melting mold of graphite having a bottom with a rectangular cross-section and lateral dimensions of 150 mm×150 mm. For the deformation process the whole melting body with the start body contained therein is first heated to 1350° C. and subsequently with a ramp 9° C./min to 1700° C. and thereafter with a ramp of 2° C./min to a temperature of 1780° C. At this temperature the glass mass is held until the softened glass has flown out under the action of its own weight into the bottom of the melting mold and has filled the mold in this process. A rectangular plate having dimensions 150 mm×150 mm×180 mm is thereby formed from the start body and is without layers and striae in all of the three viewing directions. Moreover, the homogenizing process yields a particularly uniform distribution of the components contained in the glass, e.g. hydrogen, hydroxyl groups and dopant, over the whole volume.

The glass homogenized in this way is without striae in three directions, it has bubbles with a size of not more than 0.1 mm, the sum of the bubble cross-sections being less than 0.03 mm$^2$ (based on a volume of 100 cm$^3$). The glass meets the demands of Bubble Class 0 according to DIN 58927 2/70. The distribution of the titanium concentration, measured on the basis of the thermal expansion, as is known from DE 10 2004 024 808, is characterized by a maximum deviation of less than 1% from the nominal mean value (7 wt. % TiO$_2$).

The plate consisting of particularly high-quality, homogenized, synthetic and TiO$_2$-doped glass is sawn into a total of six plates having dimensions of 150 mm×150 mm×30 mm. The three best plates with respect to the absence of bubbles are selected and processed into disc-shaped front bodies 3 in that a respective one of the plane sides is polished.

EXAMPLE 1

Support body 2 and front body 3 are optically contacted with their polished plane sides, so that one obtains a bubble-free joint due to attraction forces. This joint is heated in a furnace to a temperature of 1650° C. for a period of 15 min. This yields a melt composite body with a low-bubble contact surface.

For the elimination of mechanical stresses the body is then annealed so as to form a mirror substrate blank 1 within the meaning of the present invention. The temperature profile during annealing of the melt composite body is as follows: heating to a temperature of 1175° C., holding at said temperature for a holding period of 10 h; cooling at a cooling rate of 4° C./h to a temperature of 950° C., and holding at said temperature for a duration of 12 h, then free cooling to room temperature.

The mirror substrate body 1 produced in this way is schematically shown in FIG. 1. It is composed of components of different glass qualities, namely the front body 3 and the support body 2. The bodies are interconnected via a substantially flat and plane contact surface 6. The volume of the front body 3 accounts for about 33% of the total volume of the mirror substrate blank.

The mirror substrate blank 1 serves to produce a mirror substrate of titanium-doped glass for use in EUV lithography. To produce the mirror substrate, the top side 4 of the mirror substrate blank 1 which is formed by the front body 3 and which in the intended use faces the EUV radiation is subjected to a mechanical treatment, comprising grinding and polishing. The contour of the mirror is here produced as a convexly curved surface area 7 which can be detected in FIG. 1 as a dotted line, and of which a circular sub-area with the diameter D$_c$ is specified as the highly stressed surface area with particularly high demands being made on the quality of the surface and on the homogeneity of the glass ("highly specified volume proportion"). The surface in this area (D$_c$) is exclusively formed by the front body 3 which, in addition, has a certain oversize. Part of the curved surface contour 7 which is subject to smaller demands made on the surface quality extends up and into the area of the glass provided by the support body.

EXAMPLE 2

A further embodiment of the mirror substrate blank according to the invention and a further production method are explained with reference to FIGS. 2 to 5.

A support body 22' consisting of a commercial, titanium-doped glass is provided in the form of a solid cylinder having a circular cross-section with a diameter of 200 mm and a height of 60 mm. The glass of the support body 22' has the quality described with reference to Example 1 with respect to the absence of bubbles, dopant distribution and absence of striae. The upper front side of the support body 22' is polished.

In a separate method, a front body 23' is provided in the form of a round disc of homogenized, synthetic and TiO$_2$-doped glass of a very high quality. The glass of the front body 23' has the quality described with reference to Example 1 as regards absence of bubbles, dopant distribution and absence of striae. The disc-shaped front body 23' has a diameter of 150 mm and a thickness of 30 mm, with the one plane side being polished.

Support body 22' and front body 23' are optically contacted with their plane sides and fixed relative to each other by slight local heating. The front body 23' just covers the central area of the polished support-body face in this case.

Figure 2:
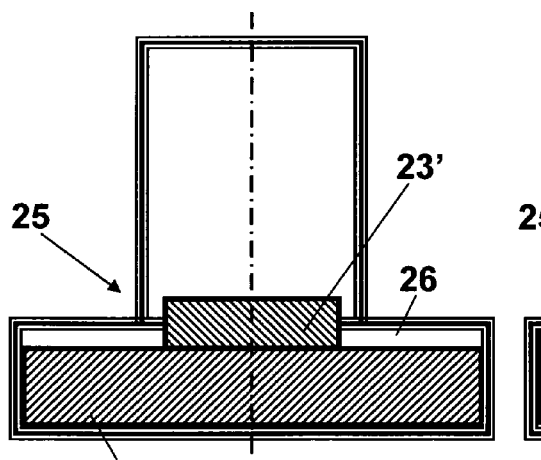
FIG. 2 shows a first method step for producing a mirror substrate blank by softening or fusing an assembly made of a support body and a front body positioned thereon in a melting mold.
Figure 3:
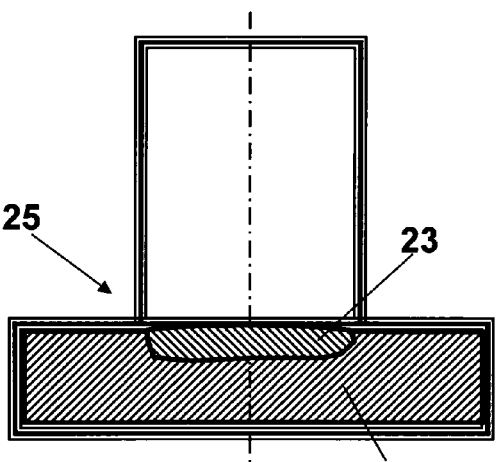
FIG. 3 shows the assembly according to FIG. 2 after melting.

FIG. 2 shows that the composite 22', 23' is introduced into a furnace with a melting mold 25 of graphite that has a bottom area 26 with a round cross-section having a diameter of 210 mm and a height of 70 mm. The melting mold 25 is heated to 1350° C. and then with a ramp 9° C./min to 1700° C. and thereafter with a ramp of 2° C./min to a temperature of 1780° C. At this temperature the glass mass is softened under vacuum. The softened glass deforms under its own weight, thereby filling the bottom 26 of the melting mold 25 completely. The glass of the support body 22' due to the weight acting thereon and also the glass of the front body 23' resting thereon are subjected to some deformation due to outflow in lateral direction. At the same time the glass of the front body 23' immerses into the support body 22' almost completely (approximately at a depth of 25 mm), as is schematically illustrated in FIG. 3. The glass of the front body 23' forms a front body mass 23, which is embedded in a support body mass 22.

Figure 4:
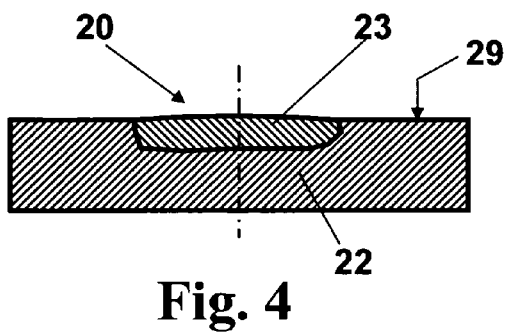
FIG. 4 shows the mirror substrate blank after removal from the melting mold.

This yields the round composite plate 20 shown in FIG. 4 with a diameter of 210 mm and a thickness of about 70 mm, the plate being composed of two masses 22, 23 of different glass qualities that are fused together. The support body mass 22 is substantially of commercial quality, the described shaping process providing for a certain additional homogenization. The central area of the support body mass 22 is covered by the front body mass 23 which consists of a higher-quality glass that is without layers and striae in all of the three viewing directions and that is distinguished by a particularly uniform distribution of the components contained in the glass, such as hydrogen, hydroxyl groups and dopant, over the whole volume and by the substantial absence of bubbles. The contact area between the masses 22, 23 is shaped in the manner of a trough; it is slightly irregular, but substantially without bubbles. The volume of the front body mass 23 is here smaller by the factor 3.5 than the volume of the support body mass 22.

The composite plate 20 is annealed in the standard way, as has been explained above with reference to Example 1. The resulting mirror substrate blank 20 serves to produce a mirror substrate 21 of titanium-doped glass for use in EUV lithography, wherein the surface area of the top side 29 of the mirror substrate 21 which is covered by the front body mass 23 faces the EUV radiation.

The described method of "letting the front body 23' immerse into" the softened support body mass 22 has the advantage that despite a certain deformation of the front body 23' the final position and final geometry of the front body mass 23 within the composite body/mirror substrate blank 20 can be predetermined relatively accurately and can still be influenced during the "immersion process". This yields an intimate and low-defect contact area, and in comparison with the method described further below with reference to Example 3 a smaller feedstock mass is needed for the front body 23' due to a comparatively smaller deformation of the front body 23'.

Figure 5:
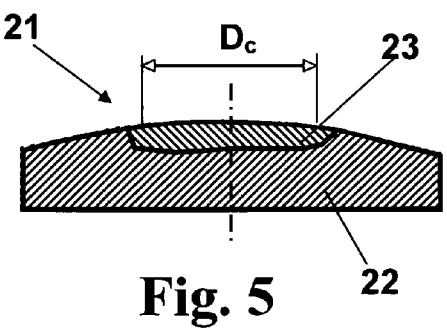
FIG. 5 shows a mirror substrate produced from the mirror substrate blank according to FIG. 4 by mechanical treatment, in a side view in section.

To produce the mirror substrate 21, the top side 29 of the mirror substrate blank 20 is subjected to a mechanical treatment comprising grinding and polishing. A convexly curved surface area as shown in FIG. 5 is thereby produced. A circular sub-area with a diameter $D_c$ of 150 mm is here specified as the highly stressed surface area with particularly high demands being made on the quality of the surface and on the homogeneity of the glass. This surface and volume area is exclusively formed by the front body mass 23. The greatest part of the surface of the mirror substrate 21 that is subject to smaller demands with respect to the surface quality is formed by the support body mass 22.

The curved surface of the mirror substrate 21 is provided with a mirror layer and the mirror element obtained is used in a projection system for EUV lithography.

A further embodiment of the mirror substrate blank according to the invention and a further method for producing the same are explained with reference to FIGS. 6 to 9.

EXAMPLE 3

FIG. 6 schematically shows a first cylinder 33' of titanium-doped glass of high quality as regards the absence of bubbles, dopant distribution and absence of striae, and a second cylinder 32' of commercial glass doped with 7 wt. % titanium and showing a lower quality as regards absence of bubbles, dopant distribution, absence of striae (as has been explained above with reference to Example 1). The outer diameter of the cylinders 32', 33' is 80 mm each time, and a respective front face 34 of the two cylinders 32', 33 is ground into a conical shape with rounded cone tip.

The cylinders 32', 33' are clamped into the chuck of a lathe and adjusted to a joint central and rotational axis. Subsequently, the acute front faces 34 of the cylinders 32', 33' are butt-jointed and simultaneously heated in the contact area under rotation and fused to each other. Due to the temperature control during the melting process the glass of the second cylinder 32' is slightly softer than the glass of the first cylinder 33', so that it deforms to a somewhat stronger degree.

A substantially cylindrical melt composite body 35 with an outer diameter of about 80 mm and a length of about 1000 mm is thereby produced, said body being schematically illustrated in FIG. 7. The body is composed of two fused glass masses 32", 33" of different qualities that are fused together in a contact area 36".

The melt composite body 35 is subjected to a shaping process in a melting mold, as described with reference to Example 2. The glass masses 32", 33" which are fused together are further deformed, which is accompanied by a reduction of still existing layers or bubbles and a further homogenization of the dopant distribution.

The mirror substrate blank 30 as shown in FIG. 8 is obtained with an outer diameter of 300 mm and a height of 71 mm. The volume of the front body mass 33 fully covers the support body mass 32 upwards and accounts for about 40% of the total volume of the blank 30. Although the contact area 36 between the glass masses 32, 33 is irregular and corrugated, it is substantially free of bubbles.

The mirror substrate blank 30 is annealed on the basis of the method described in Example 1 and is then subjected to a mechanical finishing treatment for producing the mirror substrate 31 shown in FIG. 9 with an outer diameter of 280 mm. A convexly curved surface area is here produced, of which a circular sub-area with a diameter D of 260 mm is specified as the highly stressed surface area with particularly high demands being made on the quality of the surface and the homogeneity of the glass. This surface and volume portion is exclusively formed by the front body mass 33. The greatest part of the volume of the mirror substrate blank 30 or the mirror substrate 31 obtained therefrom is however formed by the less expensive support body mass 32.

The curved surface of the mirror substrate 31 is provided with a mirror layer and the resulting mirror element is used in a projection system for EUV lithography.

The invention claimed is:

1. A method for producing a blank of titanium-doped, highly siliceous glass suitable for use as a mirror substrate used in extreme ultra violet lithography, wherein said blank has a surface area that has an outer contour to be metalized, and said surface area is specified as a highly stressed zone during the use of the mirror substrate, the method comprising the following steps:
   (a) producing a front body of titanium-doped glass of high homogeneity with a first volume and with dimensions enclosing the outer contour with an oversize;
   (b) producing a support body of titanium-doped quartz glass with a second volume, the support body being a monolithic glass block of lower homogeneity than the front body;
   (c) joining front body and support body so as to form a composite body; and
   (d) treating the composite body so as to obtain the mirror substrate blank,
   wherein the producing of the front body includes a homogenizing process which comprises a twisting process of a rod-shaped start body obtained by flame hydrolysis of a silicon-containing compound so as to form a front body blank, wherein the start body is held during the twisting process between two holders, and the start body is zonewise heated to melting temperature and the heated zone is thereby worked by relative movement of the two holders with respect to each other so as to form a substantially cylindrical twist body.

2. The method according to claim 1, wherein the cylindrical twist body is subjected to a further homogenizing process by twisting and is shaped into a twist body homogenized in three directions.

3. The method according to claim 1, wherein the producing of the front body comprises a shaping of a cylindrical start body by softening and letting said body flow out into a heated mold into which the quartz glass of the start body flows out under the action of a force in a transverse direction relative to the longitudinal axis of the cylinder so as to form a homogenized start body.

4. The method according to claim 1, wherein the front body is obtained by cutting from the twist body or from the homogenized twist body, or from the homogenized start body.

5. The method according to claim 1, wherein the producing of the front body comprises manufacture of a preform of synthetic quartz glass and a selecting method step in which a section is selected from the preform, and the front body is cut out therefrom.

6. The method according to claim 1, wherein the producing of the support body comprises homogenizing a rod-shaped start body for the support body is obtained by flame hydrolysis of a silicon-containing compound into a second twist body, wherein the start body for the support body is held between two holders during shaping, and said start body is zonewise heated to melting temperature and the heated zone is thereby worked by relative movement of the two holders relative to each other so as to form a second substantially cylindrical twist body, with the support body being obtained from the quartz glass of the second twist body.

7. The method according to claim 1, wherein the joining comprises a joining step in which a plane contact surface of the front body and a plane contact surface of the support body are joined by optical contacting and are welded to each other.

8. The method according to claim 1, wherein the joining comprises a joining step in which the front body positioned on the support body is softened in a furnace and deformed together with said support body, and said front body immerses at least in part into the support body in said joining step.

9. The method according to claim 1, wherein the joining comprises a joining step in which a contact surface of the front body and a contact surface of the support body are softened and pressed against each other, with at least one of the contact surfaces having an outwardly curved surface.

10. The method according to claim 1, wherein the composite body is annealed.

11. The method according to claim 1, wherein the second volume is at least twice as large as the first volume.

12. The method according to claim 1, wherein the front body and one or more additional front bodies, are obtained by cutting from the twist body or from the homogenized twist body, respectively, or from the homogenized start body, respectively.

13. The method according to claim 1 wherein the second volume is at least three times as large as the first volume.

* * * * *